United States Patent
Ni (10) Patent No.: US 11,282,696 B2
(45) Date of Patent: Mar. 22, 2022

(54) METHOD AND DEVICE FOR WET PROCESSING INTEGRATED CIRCUIT SUBSTRATES USING A MIXTURE OF CHEMICAL STEAM VAPORS AND CHEMICAL GASES

(71) Applicant: Dangsheng Ni, Georgetown, TX (US)

(72) Inventor: Dangsheng Ni, Georgetown, TX (US)

( * ) Notice: Subject to any disclaimer, the term of this patent is extended or adjusted under 35 U.S.C. 154(b) by 0 days.

(21) Appl. No.: 16/692,871

(22) Filed: Nov. 22, 2019

(65) Prior Publication Data
US 2021/0159067 A1 May 27, 2021

(51) Int. Cl.
| H01L 21/02 | (2006.01) |
| B08B 3/08 | (2006.01) |
| H01L 21/67 | (2006.01) |
| H01L 21/306 | (2006.01) |

(52) U.S. Cl.
CPC .......... *H01L 21/02057* (2013.01); *B08B 3/08* (2013.01); *H01L 21/30604* (2013.01); *H01L 21/6704* (2013.01)

(58) Field of Classification Search
CPC ......... H01L 21/02057; H01L 21/30604; H01L 21/6704; B08B 3/08
USPC .................. 438/745–748; 216/83, 90, 92
See application file for complete search history.

(56) References Cited

U.S. PATENT DOCUMENTS

| 5,156,173 | A | * | 10/1992 | Keyser ..................... B08B 3/08 134/108 |
| 6,332,470 | B1 | | 12/2001 | Fishkin et al. |
| 6,598,805 | B2 | | 7/2003 | Sakai et al. |
| 6,946,399 | B1 | * | 9/2005 | Lorimer ............ H01L 21/02046 134/1.3 |
| 2007/0261716 | A1 | | 11/2007 | Franklin et al. |
| 2014/0041694 | A1 | | 2/2014 | Miyazaki et al. |
| 2018/0214915 | A1 | * | 8/2018 | Butterbaugh ..... H01L 21/67051 |

FOREIGN PATENT DOCUMENTS

| CN | 101924031 A | 12/2010 |
| CN | 108971078 A | 12/2018 |
| JP | 2006026549 A | 2/2006 |
| WO | 2019241060 A1 | 12/2019 |

\* cited by examiner

*Primary Examiner* — Duy Vu N Deo
(74) *Attorney, Agent, or Firm* — Plager Schack LLP; Mark H. Plager; Kara Verryt (57) ABSTRACT

A method and device for wet processing and integrated circuit (IC) substrates using a fresh mixture of chemical steam vapors and chemical gases may include loading the substrates into an enclosed process chamber with a 90° rotatable middle section; closing the process chamber; conditioning the process chamber with preset temperature nitrogen gas; injecting a fresh mixture of chemical gas and chemical steam into the processing chamber sequentially to condense wet process fresh chemicals on site; circulating the mixture of chemical steam vapors or liquid chemicals and rotating at least one magnetic rod within the processing chamber to treat the substrates uniformly; performing a deionized water rinse of the substrates and turning on the adjustable multi-modulated megasonic energy when necessary; injecting solvent isopropyl alcohol steam vapor into the processing chamber for the Marangoni drying; completely drying the substrates and the processing chamber with hot nitrogen gas; and unloading the treated substrates.

5 Claims, 5 Drawing Sheets

METHOD AND DEVICE FOR WET PROCESSING INTEGRATED CIRCUIT SUBSTRATES USING A MIXTURE OF CHEMICAL STEAM VAPORS AND CHEMICAL GASES

BACKGROUND

The embodiments described herein relate generally to nanoscale integrated circuit (IC) wafer substrates wet chemical process treatment, and more particularly, to a method and device for replacing single wafer cleaning systems in the IC fabrication industry with more flexible wafer wet process treatments and much less wet chemical and deionized (DI) water consumption, while simultaneously doubling the wafers wet process throughput in a single process chamber.

Wet chemical process steps have been the key semiconductor processing technologies since the beginning of the IC fabrication, starting in the middle of the last century. These steps serve to etch off certain IC wafer materials, removing nonmetal and metal particle contaminants introduced by any previous processes steps and preparing an optimum surface condition for the next IC fabrication processing step. Conventional wet chemical processes account for more than 30% of the total IC manufacturing steps. Additionally, improper wet processing can cause substrate surface damage, circuit failure, a larger amount of waste of process chemicals and DI water, which can negatively affect the IC products manufacturing yield.

According to the physical chemistry theories, molecules are the smallest units for all materials. Every material's molecular size in both the liquid and vapor forms are the same; however, the distance between the molecules in the liquid form is smaller than the distance between molecules in the vapor form. In other words, liquid chemicals have a relatively larger molecular binding force with large surface tension, as compared to vapor chemicals.

Currently, with the smaller and smaller nanoscale intricate topologies of ICs, the traditional pure liquid chemical wet process methods have encountered challenges. Due to the surface tension of the liquid wet process chemical fluids, the wet chemicals are very difficult, and even impossible, to enter into the nanoscale IC trench structure of the IC for effective wet process treatment. These nanoscale trenches may be entered by the steam vapor chemicals with further enclosed pressurized processing chamber.

According to thermodynamics principles, a generating steam vapor vessel has one important variable: inner temperature, which can affect vessel pressure. Specifically, the vessel pressure will gradually increase when the chemical liquid inside the vessel is heated. When the temperature is higher than the chemical liquid boiling point, the inside vessel pressure will increase dramatically, producing more free molecules of the chemical steam vapor. Under constant vessel volume, the sharply increased vessel pressure will also compress inside steam vapor molecules to form a small amount of droplets of the liquid chemical dynamically, which is not suitable to penetrate the IC wafer nanostructure again, especially in the final wet process drying step, which is popularly done with IPA using the Marangoni drying method. As a result, a large amount of deadly water markers would be left over on the wafer surface, forming different shape of granular group that would have a serious impact on the next step of the IC wafer fabrication.

Based on the ability to eliminate and minimize cross-contamination during batch of larger IC wafers or photo mask substrates wet process, the single wafer cleaning system was developed. This cleaning method includes spraying different chemical liquids from nozzles mounted on swing arms above the single horizontal spinning wafer substrate (fixed by vacuum suction at the center or chucker pins around the wafer circumference) inside a process chamber. The major fallback of this method and system is that the throughput is too low, which is why multiple process chambers are usually integrated together in one system to raise the throughput with more hardware cost. Another downfall is that it is impossible to do the wafer substrate backside cleaning at the same time period thoroughly due to the vacuum suction or chuck pins holding structure. Moreover, it is impossible to do the IPA Marangoni drying efficiently since it cannot place substrate vertically to meet the Marangoni drying theory requirement, and it also consumes considerable amount of liquid chemicals and DI rinse water.

Therefore, what is needed is a method and device for wet process treatment of IC substrates using a mixture of high-temperature chemical gases and high-temperature chemical steam vapors, wherein the steam vapor mixture is capable of easily reaching a size less than single digit nanometer scale to sufficiently enter the wafer substrate nanoscale IC trench structure sequentially, forming an effective wet chemical thin film formula on the trench surfaces, allowing wet process treatments, such as etching and cleaning, to be done effectively, wherein the method and device is capable of doubling wafer process throughput in a single process chamber which use much less chemical and DI water consumption than existing wet process methods. The resulting wet formula chemical thin film may assist possible later pure liquid chemical wet processes to penetrate and dynamically replace reactive chemicals on the IC trench surface continuously. Moreover, what is needed is also a method and device for effectively treating more than one wafer simultaneously.

SUMMARY

Some embodiments of the present disclosure include a device and method for wet processing integrated circuit (IC) substrates using a mixture of chemical steam vapors and chemical gases. The method may include loading the substrates into a process chamber middle section; closing the process chamber middle section with its upper and lower section; conditioning the process chamber with pre-setting temperature nitrogen gas; injecting mixture of chemical gases and chemical steam vapors sequentially into the processing chamber; circulating the mixture of chemical steam vapors and rotating a magnetic rod within the processing chamber to treat the substrates uniformly; performing a deionized water rinse of the substrates with possible modulated megasonic energy; injecting solvent isopropyl alcohol steam into the processing chamber for Marangoni IPA drying; completely drying the substrates in the processing chamber with hot nitrogen gas; opening the process chamber then unloading the wet process treated substrates.

BRIEF DESCRIPTION OF THE FIGURES

The detailed description of some embodiments of the invention is made below with reference to the accompanying figures, wherein like numerals represent corresponding parts of the figures.

DETAILED DESCRIPTION

In the following detailed description of the invention, numerous details, examples, and embodiments of the invention are described. However, it will be clear and apparent to one skilled in the art that the invention is not limited to the embodiments set forth and that the invention can be adapted for any of several applications.

The device of the present disclosure may be used as a method and device for wet chemical treatment of an integrated circuit (IC) substrate and may comprise the following elements. This list of possible constituent elements is intended to be exemplary only, and it is not intended that this list be used to limit the device of the present application to just these elements. Persons having ordinary skill in the art relevant to the present disclosure may understand there to be equivalent elements that may be substituted within the present disclosure without changing the essential function or operation of the device.

The various elements of the present disclosure may be related in the following exemplary fashion. It is not intended to limit the scope or nature of the relationships between the various elements and the following examples are presented as illustrative examples only.

By way of example, and referring to FIGS. 1A-5, some embodiments of the invention include a method and device for wet processing integrated circuit (IC) substrates using a mixture of chemical steam vapors and chemical gases. As described, for example, in FIG. 3, the overall process may comprise loading the substrates (wafer or flat panel display, FPD) into the process chamber 401, closing the process chamber 402, conditioning the process chamber with hot nitrogen gas, $N_2$ 403, injecting a mixture of chemical gas and chemical steam into the processing chamber 404, circulating the mixture of chemical steam vapors and rotating a magnetic rod within the chamber to treat the substrates uniformly 405, performing a deionized water rinse of the substrates with possible modulated megasonic energy 406, completing any additional necessary process steps 407, repeating steps 403-406, if necessary, injecting solvent isopropyl alcohol (IPA) steam into the processing chamber 408 for Marangoni IPA drying, completely drying the substrates in the processing chamber with hot $N_2$ 409, and unloading the wet process treated substrates 410.

Figure 1A:
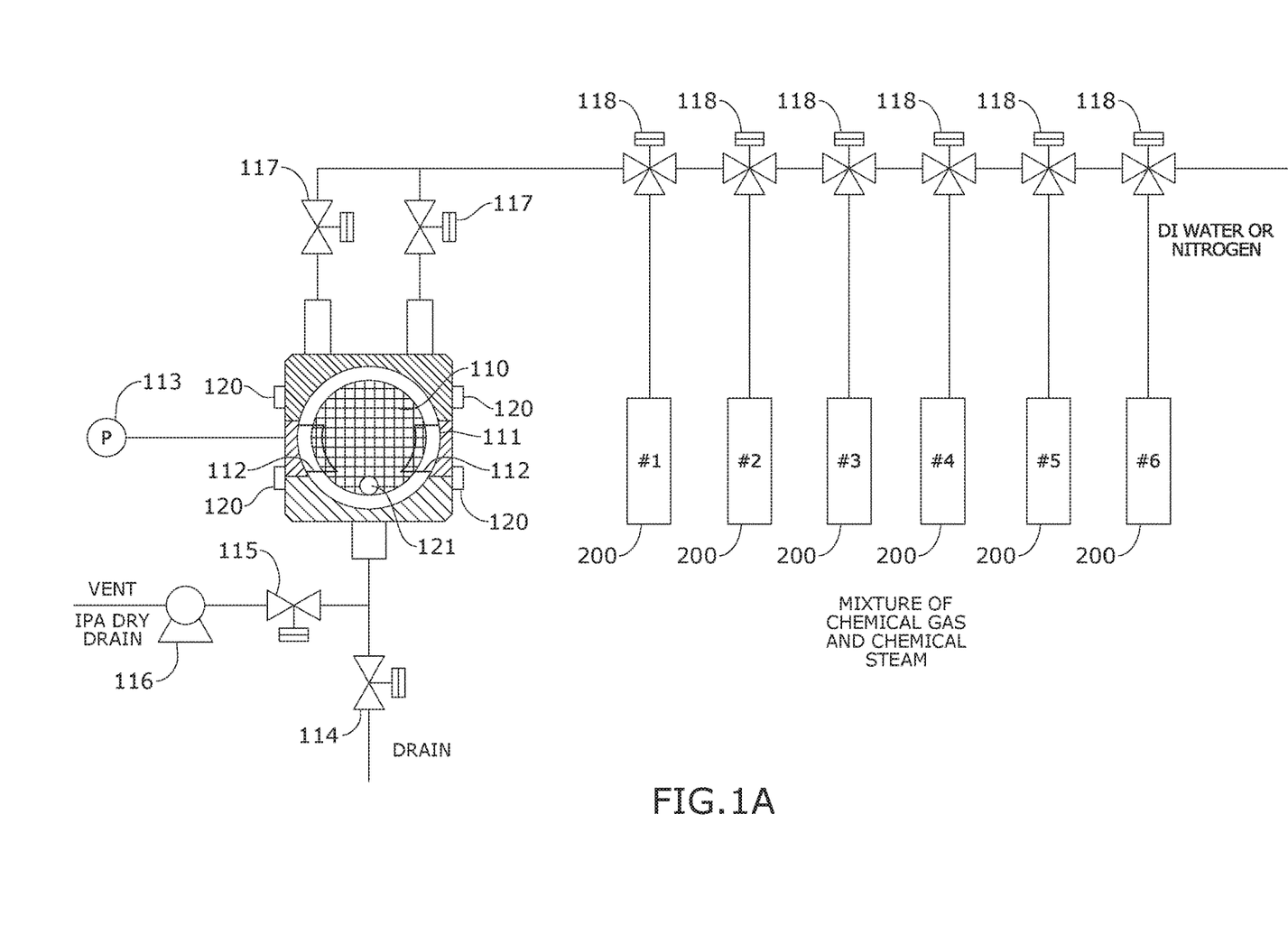
FIG. 1A is a schematic diagram illustrating an embodiment of the present disclosure for both batch wafers and double wafers wet chemical process.

As shown in FIG. 1A, the system of the present disclosure may include a process chamber 111 with a wafer holding groove 112 designed to hold at least one wafer substrate 110 for wet chemical processing. The at least one wafer substrate 110 may be held by a set of comb-like holding wafer grooves 112 to prevent the substrates from contacting one another during processing. At least one, such as a plurality of, megasonic transducers 120 may be operatively attached to the process chamber 111. At least one steam vapor inlet valve 117 may be connected to the process chamber 111, wherein pressurized steam vapor may enter the process chamber 111 through the at least one steam vapor inlet valve 117. At least one 3-way valve 118 may be operatively connected in series with the connection to the at least one steam vapor inlet valve 117, wherein each 3-way valve 118 is operatively connected to its corresponding chemical steam/gas mixture manifold 200. The three-way valves 118 may be controlled by a computerized system controller. Depending on the number of different types of chemical steam/gases to be applied to the wafer substrate 110 wet process, the number of chemical steam/gas manifolds 200 may vary. The process chamber 111 may also have a drain attached thereto, the drain may be operatively connected to an isopropyl alcohol (IPA) drain valve 115 and a waste chemical drain valve 114. The IPA drying drain valve 115 may be operatively connected to an IPA drying metering pump 116. The IPA drain metering pump 116 and the IPA drying drain valve 115 will be controlled during the IPA Marangoni drying process, which may also control the process pressure inside the process chamber 111.

In embodiments, a process chamber pressure transducer 113 may also be operatively connected to the process chamber 111, wherein the pressure transducer 113 may be used to monitor the process chamber pressure and provide feedback via electrical analog signals to a computerized system controller, which is well known in the art and not shown in the drawings. Together, the components of the system, as shown for example in FIG. 1A, provide for a mixture of chemical steam vapors to enter a process chamber 111 to be applied to a wafer substrate 110. Because of the chemicals entering the process chamber 111 in a steam vapor state, the chemicals are capable of sufficiently entering a nanoscale trench structure on the wafer substrate 110.

While the valves 117 are described above as being for the steam vapor to enter the process chamber 111, these valves 117 may also be used for entry of DI rise water and process nitrogen purge.

Figure 1B:
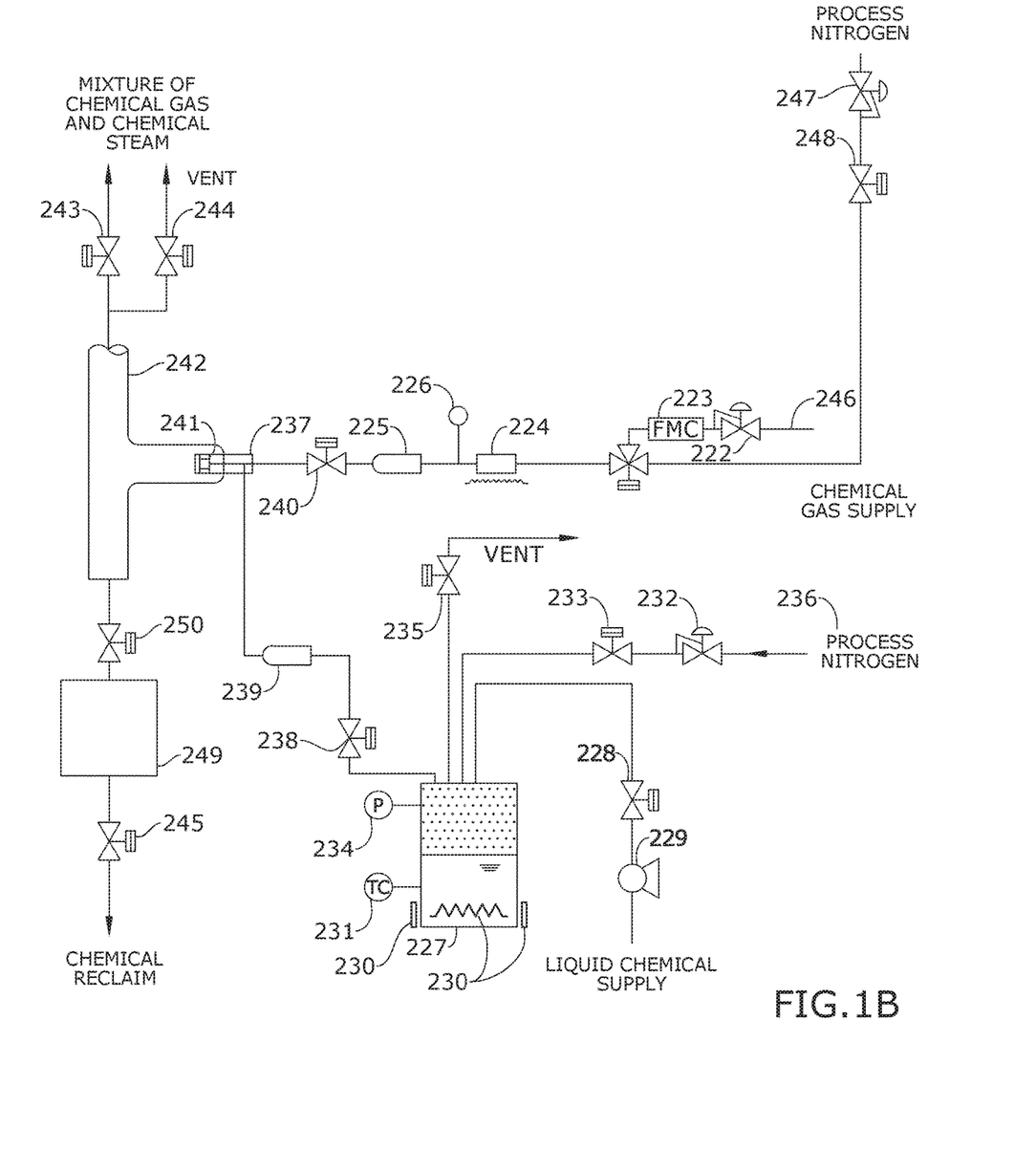
FIG. 1B is a schematic diagram of one embodiment of the present disclosure, illustrating the mixture of chemical steam vapor and chemical gas generation manifold principles.
Figure 2:
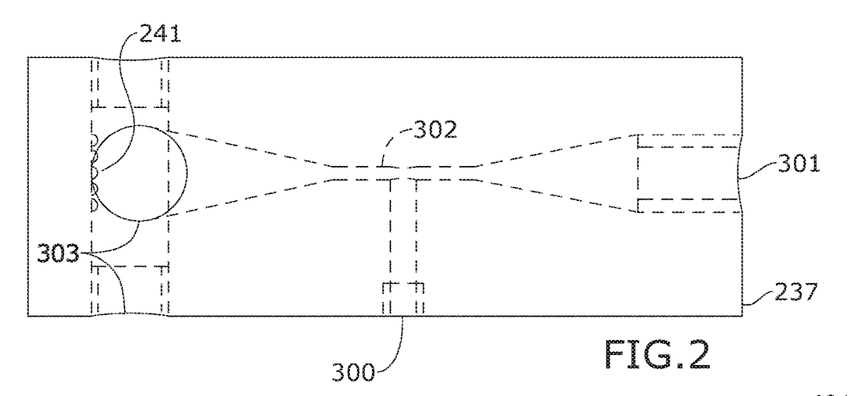
FIG. 2 is a schematic view of one embodiment of the present disclosure, showing the nebulizer design based on the Venturi effect.
Figure 3:
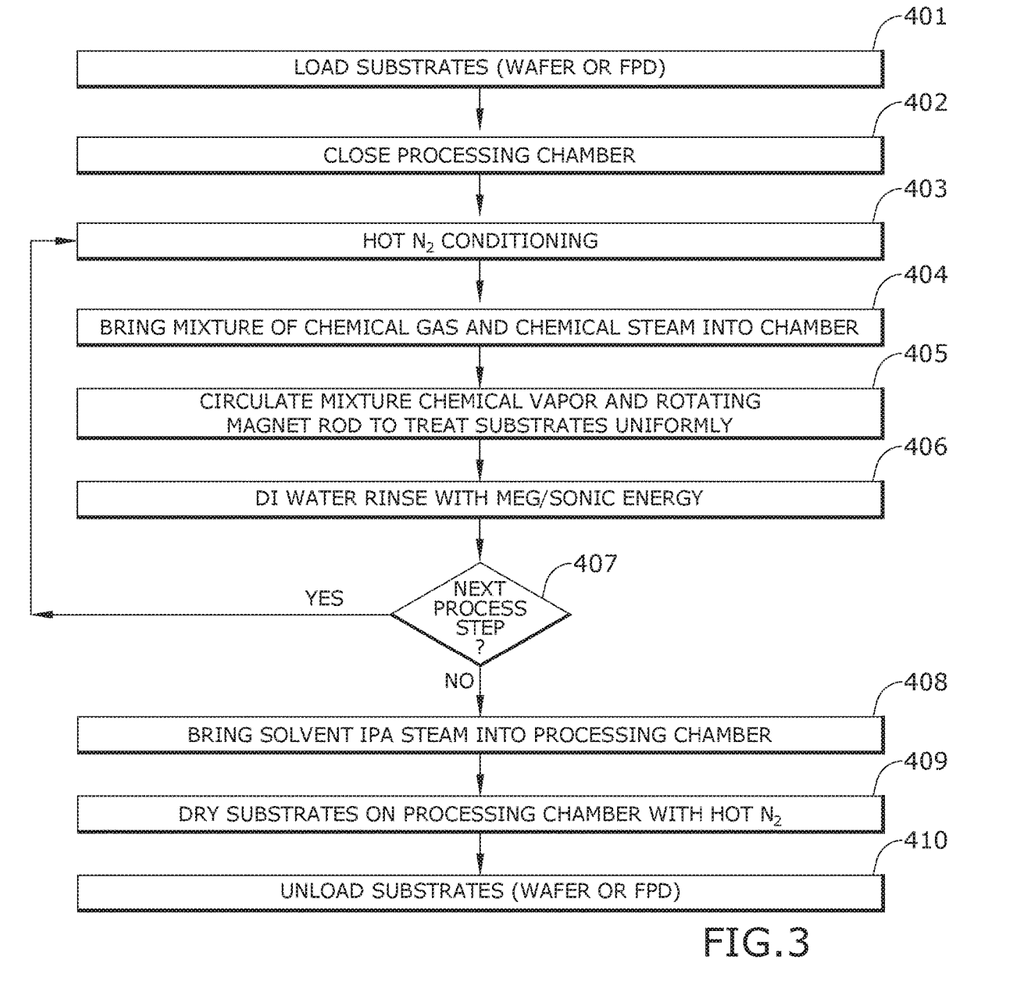
FIG. 3 is a flow diagram describing one embodiment of the present disclosure.
Figure 4:
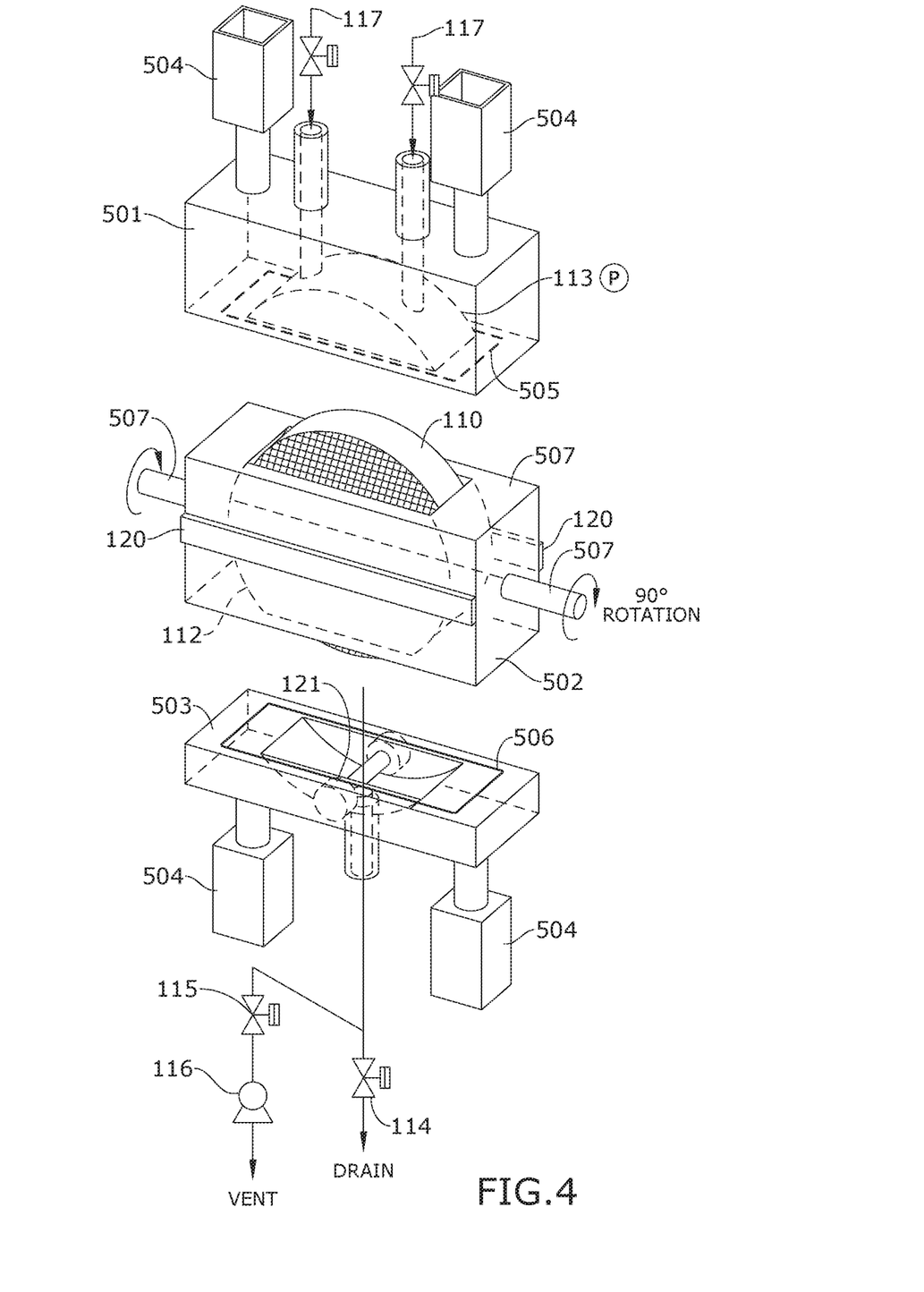
FIG. 4 is an exploded view of one embodiment of the present disclosure, showing process chamber design for double wafers wet chemical processing.
Figure 5:
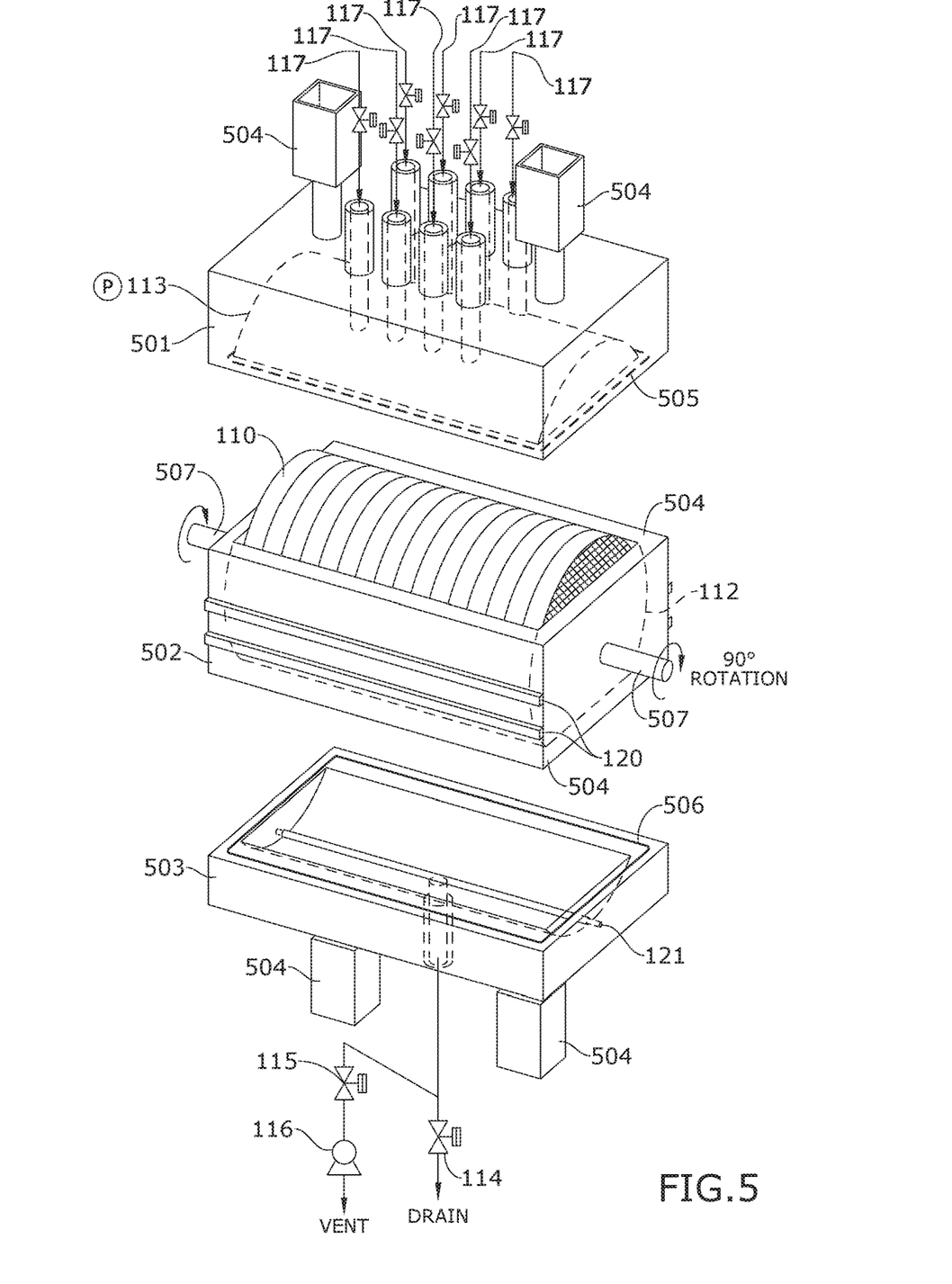
FIG. 5 is an exploded view of one embodiment of the present disclosure, showing process chamber design for batch wafers wet chemical processing.

FIG. 1B shows an exemplary diagram illustrating the chemical steam/gas manifold 200. As shown in FIG. 1B, a mixture of liquid chemical(s), process nitrogen, and chemical gas(es) may enter the manifold from their respective supplies, and a mixture of chemical gas and chemical steam may exit the manifold 200 to be used in the process chamber 111. Specifically, chemical gas(es) and chemical steam may be combined and mixed in a chemical vapor further nebulizer 237. As shown in FIG. 2, the chemical vapor nebulizer 237 may have a construction based on the Venturi effect. Thus, chemical gas(es) may enter the nebulizer 237 via a chemical gas inlet port 301 and chemical steam vapor(s) may enter the nebulizer 237 via a chemical steam vapor inlet port 300. The chemical gas(es) and the chemical steam vapor(s) may mix at a chemical vapor mixture intersection 302, generating a vacuum in the nebulizer middle smaller branch bath, causing the chemical steam vapor to suck into the nebulizer and flow together with the higher speed towards a resonator wall 241 with a high flow velocity and shatter into nanoscale nebulized vapor particles, which then exit the nebulizer 237 through an O-shaped mixture outlet fitting 303 into a vertical pipe path 242, where the desired chemical steam vapor mixture to be used in the process chamber 111 exits through a chemical steam vapor mixture outlet control valve 243. Overpressure vapors exit through a chemical vapor manifold purge venting valve 244 and the condensed chemicals exit through a condensed chemical collecting control valve 250 into a condensed chemical reclaim container 249 and out to a chemical reclaim through a condensed chemical reclaim control valve 245. Because of the design of the nebulizer, small amounts of liquid droplets may be broken/blocked to ensure only nanoscale chemical steam vapor mixture is capable of entering the process chamber 111 and penetrating into the nanoscale IC trench structure of the wafer substrates 110 to form a wet process recipe defined wet chemical formula thin film. The pressure control and flow rate control of the chemical steam vapors and the chemical gases will control the flow rate of the chemical steam vapor mixture.

Before the chemical gas(es) and chemical steam vapor(s) enter the nebulizer 237, they go through a process to prepare them for the nebulizer 237. As shown in FIG. 1B, liquid chemical flows from the liquid chemical supply trough a liquid chemical flow metering pump 229 and a liquid chemical fill control valve 228 into a chemical steam generating container 227. The number of chemical steams generating containers 227 included in a particular embodiment of the system of the present disclosure may be dependent on the required wet process recipe. For example, it may only be one (water steam DI vapor and ozone $O_3$ gas)), it may be two ($H_2O_2$ steam vapor+$NH_4OH$ steam vapor+$N_2$ gas process), or it may be more. However, regardless of the number of chemical steams generating containers 227, they may all work in a similar fashion and have a similar structure.

The chemical steam generating container may include a liquid chemical process heater 230 to heat the liquid chemicals to transform the liquid chemicals to steam vapors. The chemical steam generating container also includes a chemical container temperature sensor 231 (such as a thermocouple or an RTD) and a chemical container pressure sensor 234 to monitor and control the temperature and pressure, respectively, therein. Process nitrogen also may enter the chemical steam generating chamber 227 from a process nitrogen supply 236, through a process nitrogen pressure regulator 232 and a process nitrogen control valve 233. The chemical steam generating chamber 227 additionally includes a venting valve 235 to sufficiently vent the container as needed if and when the container pressure is too high. The generated steam vapor exits the chemical steam generating container 227 through a steam vapor outlet control valve 238 and then passes through a steam vapor outlet filter 239 before entering the process chamber through the nebulizer 237.

As also shown in FIG. 1B, process nitrogen flows from a supply through a process nitrogen regulator 247 and a process nitrogen control valve 248 and mixes chemical gas(es) from a chemical gas supply 246 at a chemical gas flowrate controller 223. The chemical gas supply 246 is operatively attached to a chemical gas pressure regulator 222 to regulate the pressure of the chemical gas(es). The chemical gases then enter a chemical gas heater 224 with a chemical gas temperature sensor 226. The heated chemical gas then proceeds through a chemical gas filter 225, which may block any possible nanoscale particles form the corresponding chemical gas, and through a chemical gas flow control valve 240 before entering the process chamber through the nebulizer 237.

As mentioned above, after exiting the nebulizer 237, the chemical steam vapor mixture enters the process chamber 111. As shown in FIGS. 4 and 5, the process chamber 111 comprises an upper section 501 operatively connected to the middle section 502, a middle section 502 capable of 90° rotation for substrate(s) loading/unloading, and a lower section 503 operatively connected to the middle section 502. In embodiments, the process chamber sections 501, 502, 503 may be sealed together during use via a process chamber sealing mechanism 504, which could be made of air-driven or electrical-driven cylinders. In fact, the upper section 501 may include an upper section O-ring 505 attached to bottom-most surface all around thereof, such that the upper section 501 and middle section 502 when sealed together have the upper section O-ring 505 sandwiched therebetween. Similarly, the lower section 503 may include a lower section O-ring 506 attached to an upper-most surface all around thereof, such that the lower section 503 and the middle section 502 when sealed together have the lower section O-ring 506 sandwiched therebetween. As shown in the Figures, the upper section 501 may include at least one steam vapor inlet valve 117 attached thereto, wherein the chemical steam vapor is designed to flow through the nebulizer into the process chamber 111 via the steam vapor inlet valve(s) 117.

As shown in FIGS. 4 and 5, the wafer holding groove 112 may be defined by a notched portion of the middle section 502 integrated together. The notched sections may be substantially arch shaped. The process chamber lower section 503 may include at least one magnetically levitating rotating rod 121 positioned therein. The rod 121 may be coated by a material (such as PFA, PTFE, or the like) that can resist almost all typical chemical liquids and gases, wherein the rod 121 may cause the substrate to rotate within the sealed process chamber during their wet process. Moreover, the middle section 502 may be capable of 90° clock or counter clock wise rotation for substrate(s) loading/unloading as indicated in FIGS. 4 and 5. As shown in these figures, the middle section 502 may include a pivot rod 507 extending from either side thereof, wherein the pivot rod 507 with its associated mechanism may provide for rotation of the entire middle section 502. Because of the disclosure of the ability to rotate process chamber middle section 90° clock or count clock wise, the wafers 110 may then be loaded/unloaded from the middle section 502 using the industry standard typical robot configuration from/to the industry standard wafer front opening unified pod (FOUP), allowing the processed wafers to be easy picked up for the wet process, and treated wafers be sent back, ready for the next IC wafer fabrication process.

Additionally, the middle section 502 may have a plurality of megasonic transducer bars 120 mounted on the outside surface thereof. For single or double wafers, the megasonic transducer bars 120 may be mounted at the chamber end section along the diameter direction, as shown in FIG. 4, and for batch wafers, the megasonic transducer bars 120 may be mounted along the chamber middle section along the front and back section thereof, as shown in FIG. 5. The megasonic transducers 120 may be energized to emit invented harmonic frequencies modulated, different-waves modulated, different-power modulated megasonic energy during the wet process rinse time for better nanoscale particles removal, when needed.

The bottom section 503 of the process chamber 111 may include a drain operatively attached to a process chamber drain valve 114 which may be operatively connected to a manifold valve for customer different waste chemical drain facilities, and also to an IPA dying drain valve 115, which may be operatively connected to a metering pump 116 for IPA drying process speed control purposes.

The device and method of the present disclosure is not limited to a particular chemical steam vapor mixture. On the contrary, the device and method can use any different combination of chemical gases to mix with different liquid chemical steam vapors for the IC substrate wet process in an enclosed process chamber, which increases the wet process flexibility dramatically. Moreover, the device and method utilize far less process chemicals and DI rinse water than existing systems and methods while also giving more process flexibility in the different IC wet chemical process treatments.

Exemplary chemical steam vapor mixtures include the following: using heated ozone gas ($O_3$) close to 100° C. to further nebulize the boiling DI water steam for substrate general organic particle removal and photo-resistor stripping; using heated hydrofluoric (HF) gas close to 158° C. to further nebulize the hydrogen peroxide steam to prevent particle adhesion to the substrate; using heated HF gas close to 158° C. to further nebulize the DI water steam for metallic and native oxide silicon etching and particle removal; using heated nitrogen ($N_2$) gas close to corresponding mixing platting chemical boiling temperature to nebulize a platting chemical steam vapor with positive electrical charged for platting negative electrical charged substrates; and using heated nitrogen gas close to corresponding mixing photo-coating chemical boiling temperature to nebulize heated photo-resistor steam vapor for substrates photo coating process. In any case, the high temperature steam vapor chemical mixture is produced by mixing the corresponding chemical steam vapor and the corresponding chemical gas, which are created by heating the chemical liquid temperature to over its boiling point and heating the chemical gas close to its corresponding mixing chemical boiling point to avoid corresponding chemical vapor condensing before entering the enclosed process chamber.

Because the method of the present disclosure uses a mixture of chemical gas and fresh chemical steam vapor, which has greater distance between molecules than their reused liquid chemical counterparts, the mixture can penetrate into the tiny nanoscale IC trench structure. The mixture may then condense sequentially to form a wet formula chemical thin film to carry out its corresponding chemical wet process treatment. As described above, the steam vapor mixture may be a pure chemical (for example, hydrogen fluoride (HF) gas and deionized water steam vapor), or the steam vapor may be a variety of chemical vapors. The most popular wet processing chemicals are currently the hydrogen peroxide ($H_2O_2$) based on RCA Standard Clean Recipes, which consists of SC-1 (ammonium hydroxide, $NH_4OH$+hydrogen peroxide, $H_2O_2$+DI water, $H_2O$ mixture) and SC-2 (hydrochloric acid, HCl+hydrogen peroxide, $H_2O_2$+DI water $H_2O$ mixture). SC-1 is used for light organic particle removal, and SC-2 is used for light metal particle removal. Other popular wet processing chemicals are SPM (sulfuric acid $H_2SO_4$+hydrogen peroxide, $H_2O_2$) and SOM (sulfuric acid $H_2SO_4$+ozone gas $O_3$). Both SPM and SOM are mainly used to remove heavy organic contaminants. Additionally, processing chemicals that are conventionally used include liquid hydrogen peroxide ($H_2O_2$) with liquid hydrofluoric (HF) to prevent copper adhesion to the silicon surface. Moreover, ozonated water ($O_3+H_2O$) may replace the SPM or SOM to save corresponding chemical waste treatment cost for better environment. While exemplary chemical steam vapor mixtures are described above, the use of other processing chemicals are envisioned.

When it comes to the mixture of chemical steam vapors, they may be brought into the process chamber sequentially with nitrogen gas, $N_2$, and then be allowed to condense sequentially then mix together to form the desired chemical formula wet process chemical thin film on the nanoscale IC trench structure surface, effectively performing the corresponding wet process treatment. The invented method and device are using fresh chemicals for the wet process every time to eliminate the possible cross-contamination of reusing liquid chemicals, which tradition wet process like the bench process is doing now. After each corresponding wet chemical steam vapor process time is over, a quick brief DI water down flow rinse may be followed, in which the invented modulated megasonic energy may be applied, when needed. Because of the rectangular shape of the megasonic transducers mounted across the diameter direction outside of the middle section of the process chamber end surface, both wafers' whole surfaces may be covered without any dead area with the magnetically levitated rotating rod, turning the wafers rotating.

To avoid the formation of the deadly water markers by small amount liquid droplets during the conventional Marangoni drying method, the device of the present disclosure includes a newly designed nebulizer. The nebulizer may be located before the chemical steam vapor mixture enters the wet process chamber. As shown in FIG. 2, the nebulizer may be designed based on the Venturi effect. The nebulizer of the present disclosure may prevent/break small amount possible smaller liquid droplets and ensure all process recipe-based nanoscale chemical steam vapor mixture get into the process chamber without any liquid droplets, allowing the chemical steam vapor mixture to penetrate into the nanoscale IC trench structure on the wafer substrates to form a wet chemical thin film on their surface and, then, to have effectively wet chemical processes completed. As such, the nanoscale gas filter may now be able to be used inline without affecting the effective passage of the chemical steam vapors mixture while simultaneously blocking and reducing the possible nanoscale contamination particles that might damage the nanometer IC on the wafer substrates.

Due to the structure of the device and the method steps, the method and device of the current disclosure may at least double the process throughput in a single process chamber with much less chemical and DI water consumption, as compared to conventional single wafer cleaning methods. Additionally, it may clean both surface of the substrate, including the backside, thoroughly without creating dead spot area(s), and it may result in much better nanoscale IC wafer wet process results with steam vapor mixture or steam vapor first with liquid chemicals compared to all current single wafer pure liquid chemical wet process cleaning systems. As described above, the method and device may also include disclosure of multi-waves, multi-harmonic frequency, and multi-energy power modulated megasonic added cleaning energy technology, which may emit the adjustable modulated meg-energy along the wafer diameter direction, resulting in the full cleaning megasonic energy coverage of the whole wafer substrate surface area with IC substrates capable of rotating inside the process chamber. The method and device may also be fully capable of taking advantage of the IPA Marangoni drying method to maximize the Marangoni Force to strip off any water droplets and particles effectively from the wafer substrate surface, which is impossible to do currently for all single wafer cleaning systems in the IC fabrication industry.

The above-described embodiments of the invention are presented for purposes of illustration and not of limitation. While these embodiments of the invention have been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

What is claimed is:

1. A method for wet chemical processing a substrate with nanoscale trench structures, the method comprising:
   positioning the substrate in a process chamber comprising an upper section, a middle section, and a lower section, wherein the middle section is configured to rotate 90° clockwise and counterclockwise for substrate loading and unloading;
   sealing the process chamber;
   conditioning the process chamber with hot nitrogen gas; and
   treating the substrate sequentially with a mixture of heated chemical steam vapors and heated chemical gases, wherein the mixture has nanoscale particles and wherein treating the substrate comprises:
      bringing the heated chemical steam vapors and the heated chemical gases into the process chamber sequentially, causing the mixture to penetrate into the nanoscale trench structures; and
      condensing the mixture sequentially to form a formulated wet process chemical thin film on surfaces of the nanoscale trench structures, wherein:
      the substrate vertically rotates within the process chamber during processing.

2. The method of claim 1, wherein producing the mixture of heated chemical steam vapors and heated gases comprises:
   heating a liquid chemical to a temperature above its boiling point to create the heated chemical steam vapor;
   heating a chemical gas close to a corresponding liquid chemical boiling point to create a heated chemical gas; and
   mixing the heated chemical gas and the heated chemical steam vapor.

3. The method of claim 1, wherein at least one magnetically levitated rotating rod is positioned in the lower section.

4. The method of claim 1, wherein at least one megasonic transducer is attached to an outer surface of the middle section along a direction of a diameter of the substrate.

5. The method of claim 4, wherein the at least one megasonic transducer emits adjustable harmonic frequencies modulated, different-waves modulated, and different power modulated energy.

* * * * *

UNITED STATES PATENT AND TRADEMARK OFFICE
CERTIFICATE OF CORRECTION

| | | |
|---|---|---|
| PATENT NO. | : 11,282,696 B2 | |
| APPLICATION NO. | : 16/692871 | |
| DATED | : March 22, 2022 | |
| INVENTOR(S) | : Dangsheng Ni | |

It is certified that error appears in the above-identified patent and that said Letters Patent is hereby corrected as shown below:

On the Title Page

Replace Title Page with attached Title Page.

In the Specification

Column 7, Line 66 - replace 'Na' with --$N_2$--.

Signed and Sealed this
Thirty-first Day of May, 2022

Katherine Kelly Vidal
*Director of the United States Patent and Trademark Office*

(12) United States Patent
Ni (10) Patent No.: US 11,282,696 B2
(45) Date of Patent: Mar. 22, 2022

(54) METHOD AND DEVICE FOR WET PROCESSING INTEGRATED CIRCUIT SUBSTRATES USING A MIXTURE OF CHEMICAL STEAM VAPORS AND CHEMICAL GASES

(71) Applicant: Dangsheng Ni, Georgetown, TX (US)

(72) Inventor: Dangsheng Ni, Georgetown, TX (US)

(*) Notice: Subject to any disclaimer, the term of this patent is extended or adjusted under 35 U.S.C. 154(b) by 0 days.

(21) Appl. No.: 16/692,871

(22) Filed: Nov. 22, 2019

(65) Prior Publication Data
US 2021/0159067 A1     May 27, 2021

(51) Int. Cl.
*H01L 21/02* (2006.01)
*B08B 3/08* (2006.01)
*H01L 21/67* (2006.01)
*H01L 21/306* (2006.01)

(52) U.S. Cl.
CPC ......... *H01L 21/02057* (2013.01); *B08B 3/08* (2013.01); *H01L 21/30604* (2013.01); *H01L 21/6704* (2013.01)

(58) Field of Classification Search
CPC ......... H01L 21/02057; H01L 21/30604; H01L 21/6704; B08B 3/08
USPC ................. 438/745–748; 216/83, 90, 92
See application file for complete search history.

(56) References Cited

U.S. PATENT DOCUMENTS

| | | | | |
|---|---|---|---|---|
| 5,156,173 A | * | 10/1992 | Keyser | B08B 3/08 134/108 |
| 6,332,470 B1 | | 12/2001 | Fishkin et al. | |
| 6,598,805 B2 | | 7/2003 | Sakai et al. | |
| 6,946,399 B1 | * | 9/2005 | Lorimer | H01L 21/02046 134/1.3 |
| 2007/0261716 A1 | | 11/2007 | Franklin et al. | |
| 2014/0041694 A1 | | 2/2014 | Miyazaki et al. | |
| 2018/0214915 A1 | * | 8/2018 | Butterbaugh | H01L 21/67051 |

FOREIGN PATENT DOCUMENTS

| | | |
|---|---|---|
| CN | 101924031 A | 12/2010 |
| CN | 108971078 A | 12/2018 |
| JP | 2006026549 A | 2/2006 |
| WO | 2019241060 A1 | 12/2019 |

* cited by examiner

*Primary Examiner* — Duy Vu N Deo
(74) *Attorney, Agent, or Firm* — Plager Schack LLP; Mark H. Plager; Kara Verryt (57) ABSTRACT

A method and device for wet processing and integrated circuit (IC) substrates using a fresh mixture of chemical steam vapors and chemical gases may include loading the substrates into an enclosed process chamber with a 90° rotatable middle section; closing the process chamber; conditioning the process chamber with preset temperature nitrogen gas; injecting a fresh mixture of chemical gas and chemical steam into the processing chamber sequentially to condense wet process fresh chemicals on site; circulating the mixture of chemical steam vapors or liquid chemicals and rotating at least one magnetic rod within the processing chamber to treat the substrates uniformly; performing a deionized water rinse of the substrates and turning on the adjustable multi-modulated megasonic energy when necessary; injecting solvent isopropyl alcohol steam vapor into the processing chamber for the Marangoni drying; completely drying the substrates and the processing chamber with hot nitrogen gas; and unloading the treated substrates.

5 Claims, 5 Drawing Sheets